(12) United States Patent
Ferreira Marques et al.

(10) Patent No.: US 11,474,653 B2
(45) Date of Patent: Oct. 18, 2022

(54) BUTTONLESS DEVICE

(71) Applicant: Cambridge Touch Technologies Ltd., Cambridge (GB)

(72) Inventors: Antonio Afonso Bras Ferreira Marques, Haddenham (GB); Arokia Nathan, Cambridge (GB); Michael Astley, Cambridge (GB); Jiahao Li, Cambridge (GB); Xiang Cheng, Cambridge (GB); Paridhi Sharma, Cambridge (GB); Constantinos Tsangarides, Cambridge (GB)

(73) Assignee: Cambridge Touch Technologies Ltd., Cambridge (GB)

( * ) Notice: Subject to any disclaimer, the term of this patent is extended or adjusted under 35 U.S.C. 154(b) by 18 days.

(21) Appl. No.: 17/077,123

(22) Filed: Oct. 22, 2020

(65) Prior Publication Data

US 2021/0124458 A1    Apr. 29, 2021

(30) Foreign Application Priority Data

Oct. 23, 2019  (GB) .................................... 1915369

(51) Int. Cl.
  *G09G 5/00*    (2006.01)
  *G06F 3/044*   (2006.01)
  *H01L 41/113*  (2006.01)
(52) U.S. Cl.
  CPC ........ *G06F 3/0445* (2019.05); *H01L 41/1132* (2013.01)

(58) Field of Classification Search
  CPC .......... G06F 3/0445; G06F 3/033; G06F 3/02; G06F 3/041; G06F 3/045; H01L 41/1132; G09G 5/08; G09G 5/00
  See application file for complete search history.

(56) References Cited

U.S. PATENT DOCUMENTS

2006/0019752 A1\*  1/2006  Ohta ................... A63F 13/2145
                                                        463/43
2006/0197750 A1    9/2006  Kerr et al.
(Continued)

FOREIGN PATENT DOCUMENTS

EP       2816453 A1    12/2014
EP       3246806 A1    11/2017
(Continued)

OTHER PUBLICATIONS

Combined Search and Examination Report under Sections 17 and 18(3) for UK application No. GB 1910126.0 dated Dec. 16, 2019, 6 pages.
(Continued)

*Primary Examiner* — Pegeman Karimi

(57) ABSTRACT

A device (1) includes a body (2) and a touch panel (3) supported by, integrated with, or underlying the body (2). The touch panel (3) includes a layer of piezoelectric material (5) disposed between a plurality of first electrodes (6) and at least one second electrode (7). The device (1) also includes at least one second piezoelectric input region (8) supported by, integrated with, or underlying a portion of the body (2) which does not correspond to the touch panel (3). The device (1) is configured to receive user input using the touch panel (3) and/or at least one piezoelectric input region (8).

20 Claims, 6 Drawing Sheets

(56) References Cited

U.S. PATENT DOCUMENTS

| | | | |
|---|---|---|---|
| 2010/0079384 A1 | 4/2010 | Grivna | |
| 2013/0027153 A1* | 1/2013 | Shin | H03H 9/173 310/341 |
| 2015/0160770 A1* | 6/2015 | Stewart | G06F 3/0488 345/173 |
| 2015/0248149 A1 | 9/2015 | Yamazaki et al. | |
| 2016/0381014 A1 | 12/2016 | Kim | |
| 2017/0262099 A1* | 9/2017 | Nathan | G06F 3/0443 |
| 2017/0308200 A1* | 10/2017 | Mugiraneza | H03K 17/962 |
| 2017/0338287 A1 | 11/2017 | Ito | |
| 2018/0299958 A1 | 10/2018 | Wang et al. | |
| 2018/0307365 A1 | 10/2018 | Chen et al. | |
| 2019/0027807 A1* | 1/2019 | Choi | H05K 5/03 |
| 2019/0191582 A1* | 6/2019 | Olien | B32B 25/08 |
| 2020/0033205 A1 | 1/2020 | Mori | |
| 2020/0240809 A1* | 7/2020 | Nagamori | H01L 41/1138 |

FOREIGN PATENT DOCUMENTS

| | | |
|---|---|---|
| KR | 20170000309 A | 1/2017 |
| WO | 2006072670 A1 | 7/2006 |
| WO | 2009144363 A1 | 12/2009 |
| WO | 2010098992 A1 | 9/2010 |
| WO | 2014098946 A1 | 6/2014 |
| WO | 2016102975 A2 | 6/2016 |
| WO | 2016208857 A1 | 12/2016 |
| WO | 2017109455 A1 | 6/2017 |
| WO | 2019021856 A1 | 1/2019 |
| WO | 2021009480 A1 | 1/2021 |

OTHER PUBLICATIONS

International Search Report and Written Opinion, dated Sep. 21, 2020 directed to International application No. PCT/GB2020/051601, 14 pages.

Combined Search and Examination Report under Sections 17 and 18(3) for UK application No. GB 1915369.1 dated Jul. 7, 2020, 13 pages.

Astley et. al., U.S. Appl. No. 17/627,101, filed Jan. 13, 2022, 57 pages.

* cited by examiner

BUTTONLESS DEVICE

CROSS-REFERENCE TO RELATED APPLICATIONS

This application is based upon, and claims the benefit of priority from United Kingdom Patent Application No. GB1915369.1, filed on Oct. 23, 2019, the entire contents of which are hereby incorporated by reference.

FIELD OF THE INVENTION

The present invention relates to a device for receiving force input. In some examples, the device may receive combined capacitive and force input.

BACKGROUND

Resistive and capacitive touch panels are used as input devices for computers and mobile devices. One type of capacitive touch panel, projected capacitance touch panels, is often used for mobile devices. An example of a projected capacitance touch panel is described in US 2010/0079384 A1.

Projected capacitance touch panels operate by detecting changes in electric fields caused by the proximity of a conductive object. The location at which a projected capacitance touch panel is touched is often determined using an array or grid of capacitive sensors. Although projected capacitance touch panels can usually differentiate between single-touch events and multi-touch events, they suffer the drawback of not being able to sense pressure. Thus, projected capacitance touch panels tend to be unable to distinguish between a relatively light tap and a relatively heavy press. A touch panel which can sense pressure can allow a user to interact with a device in new ways by providing additional information about user interaction(s) with the touch panel.

WO 2016/102975 A2 describes apparatus and methods for combined capacitance and pressure sensing in which a single signal is amplified then subsequently separated into pressure and capacitance components. WO 2017/109455 A1 describes apparatus and methods for combined capacitance and pressure sensing in which a single signal is separated into a capacitance signal, and a pressure signal which is amplified.

Devices including touch panels may often include additional input means, for example, mechanical buttons to control powering a device on and off, control volume, and so forth.

SUMMARY

According to a first aspect of the invention, there is provided a device including a body. The device also includes a touch panel supported by, integrated with, or underlying the body. The touch panel includes a layer of piezoelectric material disposed between a plurality of first electrodes and at least one second electrode. The device also includes at least one second piezoelectric input region supported by, integrated with, or underlying a portion of the body which does not correspond to the touch panel. The device is configured to receive user input using the touch panel and/or at least one piezoelectric input region.

The phrase "supported by, integrated with, or underlying the body" means supported by the body, or integrated with the body, or underlying the body.

The touch panel may be supported by, integrated with, or underlying a principal surface of the body. At least one second piezoelectric input region may be supported by, integrated with, or underlying a side surface of the body. The side surface may adjoin the principal surface.

The touch panel may be supported by, integrated with, or underlying a principal surface of the body. At least one second piezoelectric input region may be supported by, integrated with, or underlying a rear surface of the body. The rear surface may oppose the principal surface across the body.

The touch panel may be supported by, integrated with, or underlying a principal surface of the body. At least one second piezoelectric input region may be supported by, integrated with, or underlying the principal surface of the body.

At least one second piezoelectric input region may include an extension of the layer of piezoelectric material. The layer of piezoelectric material may take the form of a net which may be folded to conform to a shape of the body or a shape of a part of the body. In this context, net refers to a shape net, sometimes also referred to as a geometry net.

At least one second piezoelectric input region may include a second layer of piezoelectric material. The second layer of piezoelectric material may be formed from the same material as the layer of piezoelectric material.

At least one second piezoelectric input region may include one or more third electrodes configured to provide force sensitive buttons. Each third electrode may define a corresponding force sensitive button. At least one second piezoelectric input region may include an extension of a second electrode opposing the one or more third electrodes across the layer of piezoelectric material or the second layer of piezoelectric material. At least one second piezoelectric input region may include at least one fourth electrode opposing the one or more third electrodes across the layer of piezoelectric material or the second layer of piezoelectric material.

At least one second piezoelectric input region may include a number of third electrodes configured to provide one or more slider controls.

The touch panel may be substantially rectangular. Substantially rectangular may include rectangular or square shapes. Substantially rectangular may include quadrilateral shapes in which one or more internal angles are within ±5 degrees of 90 degrees, or within ±10 degrees of 90 degrees.

The touch panel may be substantially circular. Substantially circular may include circular. Substantially circular may include elliptical shapes having a semi-minor axis which is at least 0.9 times the semi-major axis, or having a semi-minor axis which is at least 0.95 times the semi-major axis.

The touch panel may take any regular or irregular polygonal shape. The touch panel may take an arbitrary shape.

The device and at least one second piezoelectric input region may be configured to receive input in the form of a swiping movement.

The device and at least one second piezoelectric input region may be configured to receive input in the form of a twisting movement about a substantially circular touchscreen.

The device may be a laptop computer. The device may be a portable communications device. The device may be a smart watch. The device may be a mobile phone.

A vehicle may include the device. A device included in a vehicle may include a touch panel and at least one second piezoelectric input region which may be operative to receive input using a combination of piezoelectric signals and capacitive sensing.

Piezoelectric signals and capacitive sensing may be conducted using the same set of electrodes in the touch panel. Piezoelectric signals and capacitive sensing may be conducted using the same set of electrodes in at least one second piezoelectric input region.

The device may be a peripheral for a computing device. A computing device may be a desktop or laptop personal computer, a portable communications device, a mobile phone, a watch, a tablet computer. The device may be a keyboard. The device may be a screen/display cover for a laptop or tablet computer. The touch panel and at least one second piezoelectric input region may be operative to receive input using a combination of piezoelectric signals and capacitive sensing.

100261 At least one second piezoelectric region may be configured to be illuminated. At least one second piezoelectric region may be at least partially transparent or translucent. At least one second piezoelectric region may include a diffuser. At least one second piezoelectric region may be illuminated using a light-emitting diode. A light emitting diode may be mono-colour or multi-colour. The device may be configured to change the colour of light illuminating at least one second piezoelectric region in response to user input, for example applied force. The device may be configured to illuminate at least one second piezoelectric region with a first colour in response to capacitive detection of a user touch and/or in response to a detected applied force exceeding a first threshold. The device may be configured to illuminate at least one second piezoelectric region with a second colour in response to detecting application of a force exceeding a second threshold. The device may be configured to illuminate at least one second piezoelectric region with a third colour in response to detecting application of a force exceeding a third threshold.

A light-emitting diode, or a region of at least one second piezoelectric region configured to be illuminated, may be offset from one of more third electrodes used to receive user input to the second piezoelectric region. A light-emitting diode, or a region of at least one second piezoelectric region configured to be illuminated, may coincide with or overlap one of more third electrodes used to receive user input to the second piezoelectric region.

According to a second aspect of the invention, there is provided a method including controlling at least one function of a computer program based on input received from at least one second piezoelectric input region of a device according to the first aspect.

BRIEF DESCRIPTION OF THE DRAWINGS

Certain embodiments of the present invention will now be described, by way of example, with reference to the accompanying drawings in which.

DETAILED DESCRIPTION

Figure 1:
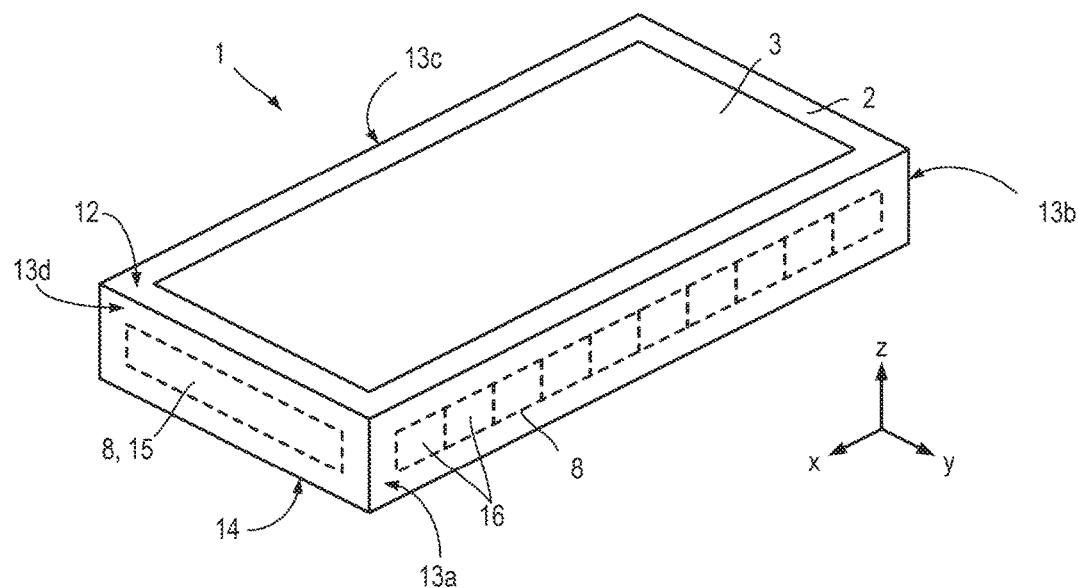
FIG. 1 is a projection view of a device.

In the following description, like parts are denoted by like reference numerals.

Electronic devices may be vulnerable to ingress of liquids or small particles (for example dust), which may cause malfunctions of and/or damage to internal electronics and/or batteries. Conventional mechanically actuated buttons typically require a break or discontinuity in a housing, casing or body of an electronic device, which must be sealed if it is desired to prevent ingress of liquids or small particles. Sealing of a conventional mechanical button may be less effective than having no break or discontinuity in the housing, casing or body. One option for replacing mechanical buttons is capacitive buttons. However, when controls/buttons are to be located on the sides and/or rear of a device which a user is intended to hold, capacitive buttons may be unsuitable because they cannot differentiate between a user intentionally pressing on the button, and a user simply holding the device in their hand.

The present specification concerns devices which utilise piezoelectric based force measurements. Piezoelectric based force measurements only require extremely small strains, which may be transmitted through the housing, casing or body of an electronic device whilst maintaining continuity of the housing, casing or body. Additionally, a minimum applied pressure threshold may be used to prevent accidental actuation by a user who is merely trying the hold the device in their hand.

The present specification also concerns using a single piezoelectric material layer to provide a touch panel and additionally one or more second piezoelectric input regions elsewhere on the surface of a device. The piezoelectric material layer may be shaped and/or folded to conform to the shape of the housing, casing or body of an electronic device. This may help to simplify the fabrication of a device having input controls in multiple locations and/or on multiple different surfaces.

Figure 2:
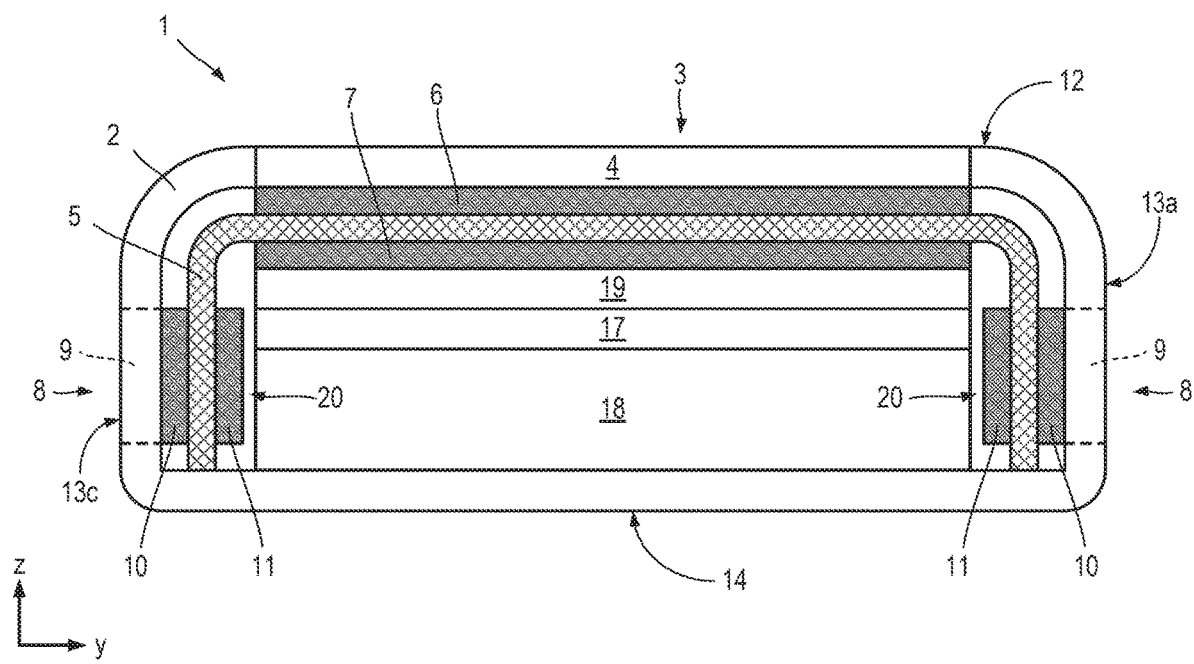
FIG. 2 is a cross-section view of the device shown in FIG. 1.

Referring to FIGS. 1 and 2, a device 1 is illustrated.

The device 1 includes a body 2 and a touch panel 3 which is supported by, integrated with, or underlies the body 2. The touch panel 3 may be exposed on the surface of the body 2 or may be protected by a cover 4 or window. Alternatively, the touch panel 3 may be located beneath a surface of the body 2, so that a user provides input to the touch panel 3 through the structure of the body 2. The touch panel 3 includes a layer of piezoelectric material 5 disposed between a plurality of first electrodes 6 and at least one second electrode 7.

The device 1 also includes one or more second piezoelectric input regions 8. Each second piezoelectric input region 8 is supported by, integrated with, or underlies a portion of the body 2 which does not correspond to the touch panel 3. Some or all of the second piezoelectric input regions 8 may be located beneath a surface of the body 2, so that a user provides input to the touch panel 3 through the structure of the body 2. Alternatively, some or all of the second piezoelectric input regions 8 may be exposed on the surface of the body 2, or may be protected by a second cover or window 9. Each second piezoelectric input region 8 touch panel includes a layer of piezoelectric material 5 disposed between one or more third electrodes 10 and at least one fourth electrode 11. Alternatively, a second electrode 7 may extend beyond the touch panel 3, so that a second piezoelectric input region 8 touch panel may include a layer of piezoelectric material 5 disposed between one or more third electrodes 10 and at least one second electrode 7.

The device 1 is configured to receive user input using the touch panel 3 and/or the second piezoelectric input regions 8.

In the example shown in the FIGS. 1 and 2, the body 2 has a principal surface 12. Side surfaces 13a, 13b, 13c, 13b adjoin the principal surface 12 along connecting edges. In this example, the principal surface 12 is rectangular and there are four adjoining side surfaces 13a, 13b, 13c, 13d. However, the shape of the principal surface 12 is not limited, and there may be more or fewer side surfaces 13 consistent with the shape of the principal surface 12. For example, in a device 1, 36 (FIG. 5) having a circular principal surface 12, there may be a single, curved side surface 13. A rear surface 14 opposes the principal surface 12 across the body 2.

Second piezoelectric input regions 8 may be supported by, integrated with, or underlie, any of the side surfaces 13a, 13b, 13c, 13d or rear surface 14 of the body 2. In some examples, one or more second piezoelectric input regions 8 may be supported by, integrated with, or underlie, the principal surface 12, for example offset from the touch panel 3 (see FIGS. 8 to 10).

As shown in FIG. 2, the layer of piezoelectric material 5 providing some or all of the second piezoelectric input regions 8 may be an extension of the layer of piezoelectric material 5 which is part of the touch panel 3. This may help to simplify manufacture of the device 1, depending on the geometry of the body 2 and on the desired shapes and locations of the touch panel 3 and second piezoelectric input regions 8. For example, a single layer of piezoelectric material 5 may be formed as, or cut-out to form, a net which may be folded to conform to a shape of the body 2 or a shape of a part of the body 2. Alternatively, some or all of the second piezoelectric input regions 8 may include a second layer of piezoelectric material (not shown) which is separate from the layer of piezoelectric material 5.

A second piezoelectric input region 8 may provide a single region 15 corresponding to a single third electrode 10. Alternatively, a second piezoelectric input region 8 may include two or more third electrodes 10 dividing the second piezoelectric input region 8 into a number of force sensitive buttons 16, each of which may be actuated separately.

The counter-electrodes for a single region 15, or for one or more force sensitive buttons 16, may be provided by separate fourth electrodes 11 which oppose the respective third electrodes 10 across the layer of piezoelectric material 5 or a second layer of piezoelectric material (not shown). Alternatively, when the layer of piezoelectric material 5 providing the touch panel 3 is extended to provide some or all of the second piezoelectric input regions 8, the second electrode(s) 7 of the touch panel 3 may also extend to oppose the third electrodes 10 of the corresponding second piezoelectric input regions 8.

The touch panel 3 and the second piezoelectric input regions 8 may receive only force inputs. In other words, all input may correspond to piezoelectric currents induced in the first, second, third and/or fourth electrodes 6, 7, 10, 11. Alternatively, in some examples the touch panel 3 may operate based on combined measurements of force and electrode 6, 7 capacitance. Additionally or alternatively, one, some or all of the second piezoelectric input regions 8 may operate based on combined measurements of force and electrode 10, 11 capacitance. The touch panel 3 may be a combined projected capacitance and piezoelectric force sensor and the second piezoelectric input regions 8 may operate based only on piezoelectric force measurements.

When the touch panel 3 combines piezoelectric and capacitive measurements, the two types of measurement are preferably conducted using the same set of first and second electrodes 6, 7 electrodes in the touch panel 3. For example, a given first electrode 6 may be addressed to measure a capacitance and a piezoelectric charge $Q_{piezo}$ induced by polarisation of the layer of piezoelectric material 5 at the same time (by separation of superposed signals). Alternatively, a given first electrode 6 may be addressed to measure a capacitance during a capacitance measurement period, then used to measure a piezoelectric charge $Q_{piezo}$ during a subsequent force measurement period. In other words, capacitance and force measurements may be time-multiplexed using a single first electrode 6. Similarly, when a second piezoelectric input region 8 combines piezoelectric and capacitive measurements, the two types of measurement are preferably conducted using the same third electrode 10 whether concurrently or by time-multiplexing the capacitance and force measurements.

Referring in particular to FIG. 2, the device 1 also includes electronics 17 for controlling operation of the device 1 and processing inputs from the touch panel 2 and one or more second piezoelectric input regions 8. In the example illustrated in FIG. 2, the device 1 also includes a battery 18 to provide power and a display 19 underlying the touch panel 3. When a display 19 is included, the touch panel 3 should be transparent, so that the combination of the touch panel 3 and the display 19 provides a touchscreen. Although illustrated with the touch panel 3 overlying the display 19, in some examples the touch panel 3 may be embedded in, or integrally formed as a part of, the display 19.

In other examples (see for example FIG. 8 or 9), the touch panel 3 need not overlie or be associated with a display 19, and the touch panel 3 may be opaque. Although a battery 18 is required when the device 1 is intended to be self-sufficient, in other examples (see FIG. 9) the device 1 may be intended for use as a peripheral for a separate computing device (not shown). In such examples, the device 1 may not need a battery 18, and may instead by directly powered via a wired or wireless link with the separate computing device (not shown).

In the example illustrated in FIG. 2, a gap 20 is provided behind the second piezoelectric input regions 8 in order to improve the compliance of the body 2 locally to the second piezoelectric input regions 8. This may be useful when the device 1 takes the form of a cuboid having relatively extensive principal and rear surfaces 12, 14 and relatively narrow side surfaces 13a, 13b, 13c, 13d. With such a body 2, side surfaces 13a, 13b, 13c, 13d will in general experience less deformation to a given centrally applied force than the larger principal or rear surfaces 12, 14. In other examples, gaps 20 may be omitted and alternative methods for ensuring adequate strain response of the second piezoelectric input regions 8 to user applied forces may be used. In some examples, the body 8 may be locally thinned (though still continuous) or otherwise shaped to ensure measureable signal from a second piezoelectric input region 8 in response to a force which a user may comfortably generate using a finger or thumb (digit). In other examples, a cover or window 9 overlying all or part of a second piezoelectric input region 8 may be formed of a material which is relatively more compliant that the main body 2. In other examples, the second piezoelectric input region 8 may be positioned to overlie the body 2.

The electronics 17 measure piezoelectric signals from the first electrodes 6 and third electrodes 10, either individually or in groups. The second electrode(s) 7, and where used fourth electrode(s) 11, may provide counter-electrodes for measurements using the first electrodes 6 and/or third electrodes 10. Alternatively, piezoelectric signals may additionally be measured from the second electrode(s) 7 and/or fourth electrode(s) 11. The electronics 17 may measure piezoelectric signals using charge amplifiers (not shown), each charge amplifier (not shown) corresponding to one, or a group of, first electrodes 6 or third electrodes 10. Charge amplifiers (not shown) may also be used when piezoelectric signals from the second and/or fourth electrodes 7, 11 are measured.

Figure 3:
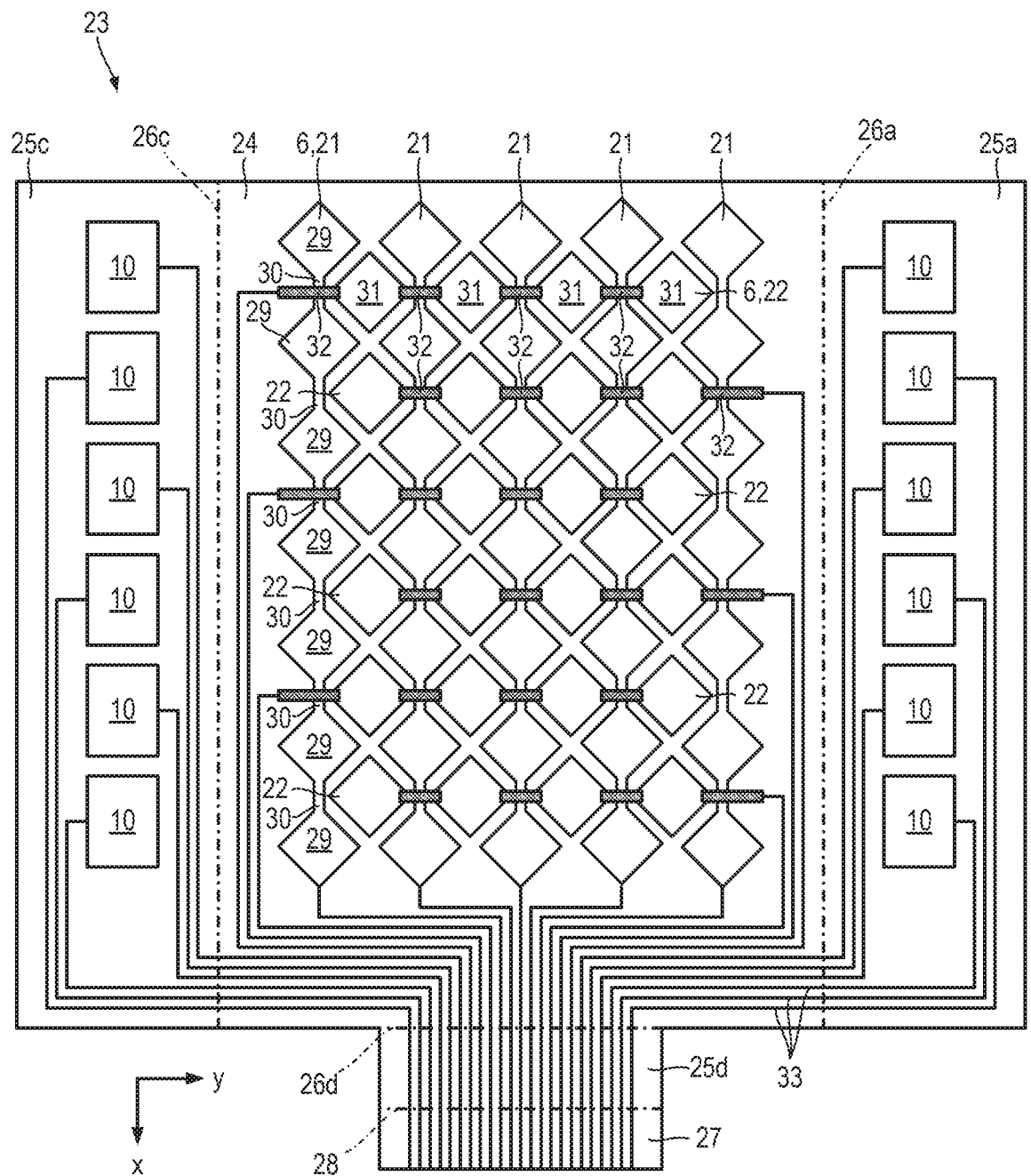
FIG. 3 is a plan view of a sensor for a device.

Optionally, the electronics 17 may also measure self-capacitance signals corresponding to each first electrode 6 and/or third electrode 11. In some examples, the first electrodes 6 may be divided into driving and sensing electrodes 21, 22 (FIG. 3), which may be disposed on the same surface as one another, or with a dielectric layer separating the driving and sensing electrodes 21, 22 (FIG. 3). The electronics 17 may measure mutual capacitances between intersections of the driving and sensing electrodes 21, 22. The electronics 17 may measure capacitances signals and the piezoelectric signals concurrently. Alternatively, the electronics 17 may alternate between measuring capacitances and measuring the piezoelectric signals, in order to time-multiplex the measurements.

The electronics 17 may include one or more circuits configured for combined capacitance and piezoelectric pressure measurements as described in WO 2016/102975 A2, the entire contents of which are incorporated herein by reference. In particular, the electronics 17 may include one or more circuits configured as described in relation to examples shown FIGS. 21 to 26 of WO 2016/102975 A2. Alternatively, the electronics 17 may include one or more circuits configured for combined capacitance and piezoelectric pressure measurements as described in WO 2017/109455 A1, the entire contents of which are incorporated herein by reference. In particular, the electronics 17 may include one or more circuits configured as described in relation to examples shown in FIGS. 4 to 21 of WO 2017/109455 A1.

However, the devices 1 and methods of the present specification are not limited to these examples, and are applicable to any electronics 17 which are capable of providing the hereinbefore described functions.

The piezoelectric signals, and optionally the capacitance signals, are produced in response to a user interaction with the touch panel 3, a second piezoelectric input region 8, or with a cover 4, 9 or portion of the body 2 overlying either. In the following description, reference to a "user interaction" shall be taken to include a user touching or pressing the touch panel 3, a second piezoelectric input region 8, or a cover 4, 9 or portion of the body 2 overlying either. The term "user interaction" shall be taken to include interactions involving a user's digit or a stylus (whether conductive or not). The term "user interaction" may also, in examples including capacitive sensing, be taken to include a user's digit or conductive stylus being proximate to the touch panel 3 or a second piezoelectric input region 8 without direct physical contact (i.e. zero or negligible applied pressure).

The electronics 17 include one or more controllers, processors or equivalent digital electronic data processing means which process the corresponding piezoelectric signals, and optionally capacitance signals, to determine a location of a user interaction and an associated input force. When a user interaction occurs with the touch panel 3 the electronics 17 may determine coordinates of the user interaction, for example (x, y) coordinates, with respect to the touch panel 3, in addition to an input force. When there are multiple user interactions with the touch panel 3 at the same time, or overlapping in time, the electronics 17 may measure an input force corresponding to each user interaction. Alternatively, the electronics 17 may measure a single, global force input to the touch panel 3. When a user interaction occurs with a single region 15 or with one or more force sensitive buttons 16, the electronics 17 process the corresponding piezoelectric signals, and optionally capacitance signals, to determine which regions 15 and/or buttons 16 have been pressed and a force input corresponding to each.

When the device 1 is a free-standing or independent device, the (x, y) coordinates and/or the identity of actuated regions 15 or buttons 16, along with associate forces, may be passed to one or more computer programs (applications and/or and operating system) being executed by the device 1. The (x, y) coordinates and/or the identify of actuated regions 15 or buttons 16, along with associate forces, may be used to control or modify at least one function of such computer programs. Examples of free-standing or independent devices include, but are not limited to, desktop or laptop computers, and portable communications devices such as mobile phones, tablet computers, wearable devices such as smart watches, and so forth. In other examples, the device 1 may be embedded in a vehicle, for example as part of the dashboard controls for a vehicle (see FIG. 10).

When the device 1 is peripheral for a separate computing device (not shown), the (x, y) coordinates and/or the identity of actuated regions 15 or buttons 16, along with associated forces, may be passed to one or more computer programs (applications and/or and operating system) being executed by the separate computing device (not shown). The (x, y) coordinates and/or the identify of actuated regions 15 or buttons 16, along with associated forces, may be used to control or modify at least one function of such computer programs.

A second piezoelectric input region 8 may be configured to provide a slider control by linearly disposing a number of third electrodes 10 along a length of the second piezoelectric input region 8. In this way, a user interaction in the form of a "swiping" gesture or movement along the line of third electrodes 10 may be detected as a sequence of piezoelectric signals induced in the third electrodes 10. Intermediate positions of the "slider" may be interpolated, for example, when a user interaction actuates a pair of adjacent buttons.

There are several advantages of using second piezoelectric input regions 8. Firstly, unlike conventional mechanical buttons, second piezoelectric input regions 8 have no moving parts and may underlie the body 2. In this way, the body 2 need include fewer discontinuities or breaks, and may be more easily protected against ingress of liquids and/or fine particles. Although similar sealing advantages could be obtained using purely capacitive buttons, purely capacitive buttons cannot differentiate between a user intentionally actuating a button and a user merely holding a device 1 with a digit or part of their hand close to a capacitive button. The devices 1 and methods of the present specification overcome such issues, by providing similarly reliable (intentional) actuation to mechanical buttons by comparing the input force to a threshold value. At the same time, the devices 1 and methods of the present specification may also avoid the disadvantages of conventional mechanical buttons, which may provide structural or environmental protection weaknesses in a body of a conventional device.

As explained hereinbefore, the touch panel 2 may be combined with a display 19 to form a touchscreen, or the touch panel 2 may be an opaque track pad. Although the second piezoelectric regions 8 may by opaque, in some examples it may be useful for one or more of the second piezoelectric regions 8 to be transparent or translucent to permit illumination of the corresponding region 15 or button(s) 16. Illumination is preferably provided using one or more light-emitting diodes, which may be mono-coloured or multi-coloured depending on the application. Illuminating one or more of the second piezoelectric regions 8 may provide feedback to a user in relation to the input state of a region 15 or button(s) 16. For example, a button 16 may be illuminated in a first colour to indicate that a user interaction has been detected, but the input force is below a threshold level for actuation. Detection of the presence of a light touch/no force user interaction may be provided from capacitive measurements in devices 1 using combined force and capacitance measurements. Once a user increases an input force enough to exceed a predetermined force threshold, the colour illuminating the button 16 may be changed to a second colour. More complex input and feedback schemes may be implemented, for example, the button 16 may be illuminated using a third colour once a second, higher input force threshold is reached. The first and second force thresholds may correspond to any suitable functions such as, for example, a light press for a "left mouse" action and a heavy press for a "right mouse" action, corresponding to the two input buttons on a conventional computer mouse.

In another example, when a second piezoelectric input region 8 is configured as a slider with a number of buttons 16, the button 16 corresponding to a current value of the slider may be illuminated. When the device 1 is configured to interpolate intermediate locations between buttons 16, the illumination may be provided on a finer scale than the buttons 16 to allow illumination centred closer to the interpolated location. First and second force thresholds may be used to provide advanced functionality. For example, in order to the move the slider position, a user may need to "pick up" the slider by applying an input force exceeding a first threshold to the present location, then maintain that force to move the slider position. Once the user lets the input force drop below the first threshold, the new position and corresponding value of the slider is set. To provide a quick alternative method of setting a new position, a user press with an input force exceeding a second, higher threshold value may allow an immediate shift of the slider value to the pressed location.

Second piezoelectric input regions 8 may be illuminated directly from behind using one or more light-emitting diodes (not shown), or may be illuminated from a side position. A cover or window 9 may include a light diffusing material. A cover or window 9 may include opaque parts and transparent/translucent parts which combine to define a shape, a letter, a numeral or a character. Alternatively, instead of illuminating a region 15 or button 16 of a second piezoelectric input region 8 directly, a light emitting diode offset from, but corresponding to, that region 15 or button 16 may be illuminated.

Additional feedback may be provided to indicate actuation of a region 15, a button 16 or the touch panel 3 itself, for example, haptic vibrations may be provided once an input force exceeds a first threshold. Multiple levels of force input may also be indicated using vibrations, for example, the intensity and/or frequency of vibration may be changed corresponding to a number of pre-determined input force ranges, or continuously based on a value of input force. Sounds may also be emitted by a speaker (not shown) of the device 1 (or a connected computing device) to provide additional or alternative feedback that sufficient input force has been applied to actuate a region 15 or button(s) 16.

Although illustrated in FIG. 2 in contact with the layer of piezoelectric material 5, the first electrodes 6 may be separated from the layer of piezoelectric material 5 by one or more dielectric layers (not shown). When the first electrodes 6 include driving and sensing electrodes 21, 22, one of more dielectric layers (not shown) may be provided between the driving electrodes 21 and sensing electrodes 22. Similarly, one or more dielectric layers (not shown) may separate the second electrode(s) 7 from the layer of piezoelectric material 5. One or more dielectric layers (not shown) may separate the third electrodes 10 from the layer of piezoelectric material 5. One or more dielectric layers (not shown) may separate the fourth electrodes 11 from the layer of piezoelectric material 5. In examples in which the layer of piezoelectric material 5 extends from the touch panel 3 to provide one or more second piezoelectric input regions, any associated dielectric layers (not shown) may co-extend with the layer of piezoelectric material 5.

In some examples the roles or locations of the first and second electrodes 6, 7 may be exchanged and/or the roles or locations of the third and fourth electrodes 10, 11 may be exchanged.

The layer of piezoelectric material 5 may include or be formed of a piezoelectric polymer such as polyvinylidene fluoride (PVDF) or polylactic acid. However, the layer of piezoelectric material 5 may alternatively be a layer of a piezoelectric ceramic such as lead zirconate titanate (PZT). The electrodes 6, 7, 10, 11 may be formed from silver nanowires. Alternatively, the electrodes 6, 7, 10, 11 may be formed of transparent conductive oxides such as indium tin oxide (ITO) or indium zinc oxide (IZO). The electrodes 6, 7, 10, 11 may take the form of metal films such as aluminium, copper, silver or other metals suitable for deposition and patterning as a thin film. The electrodes 6, 7, 10, 11 may be conductive polymers such as polyaniline, polythiphene, polypyrrole or poly(3,4-ethylenedioxythiophene) polystyrene sulfonate (PEDOT/PSS). The electrodes 6, 7, 10, 11 may be formed from a metal mesh, metallic nanowires, graphene, and/or carbon nanotubes. When used, dielectric layer(s) (not shown) may include layers of a polymer dielectric material such as polyethylene terephthalate (PET) or layers of pressure sensitive adhesive (PSA) materials. Alternatively, any dielectric layer(s) (not shown) which are included may take the form of layers of a ceramic insulating material such as aluminium oxide.

Referring also to FIG. 3 a sensor 23 for a device 1 in the form of a mobile phone or smart phone is shown in plan view.

The sensor 23 includes a principal surface portion 24 which is separated from side surface portions 25a, 25c, 25d by respective fold lines 26a, 26c, 26d. A "fold-under" portion 27 is separated from the side surface portion 25d by a fold line 28. The sensor 23 may include a layer of piezoelectric material 5 upon which the electrodes 6, 7, 10, 11 are directly disposed. Alternatively, the sensor 23 may include a layer of piezoelectric material 5 and one or more dielectric layers (not shown) laminated to the layer of piezoelectric material 5. When one or more dielectric layers (not shown) are included, the electrodes 6, 7, 10, 11 may be deposited on any of the layer of piezoelectric material 5 and/or the dielectric layers (not shown).

First electrodes 6 in the form of driving electrodes 21 extend in a first direction x and are spaced apart from one another in a second direction y. Each driving electrode 21 includes a number of diamond shaped pad portions 29 spaced apart in the first direction x and electrically connected by relatively narrower bridging sections 30. First electrodes in the form of sensing electrodes 22 extend in the second direction y and are spaced apart in the first direction x. Each sensing electrode 22 includes a number of diamond shaped pad portions 31 spaced apart in the first direction x and electrically connected by relatively narrower jumpers 32. The jumpers 32 are insulated from the bridging sections 30 at the intersections. The first electrodes 6 in the form of driving electrodes 21 and at least the pad portions 31 of the sensing electrodes 22 are disposed on the same surface, which may be a surface of the layer of piezoelectric material 5 or a dielectric layer (not shown) arranged between the first electrodes 6 and the layer of piezoelectric material 5.

A single second electrode 7 underlies the first electrodes 6, and may be substantially coextensive with the principal surface portion 24.

Although referred to as driving and sensing electrodes 21, 22 for convenience, in devices 1 the driving and sensing electrodes 21, 22 may be used in a number of ways, including but not limited to:

Using each driving electrode 21 and each sensing electrode 22 for piezoelectric force measurements only.

Using each driving electrode 21 and each sensing electrode 22 for piezoelectric force measurements and also for self-capacitance measurements. Force and capacitance measurements may be concurrent or time multiplexed.

Using each driving electrode 21 and each sensing electrode 22 for piezoelectric force measurements. Additionally using driving electrodes 21 as transmitting electrodes for mutual capacitance measurements and using sensing electrodes 22 as receiving electrodes for mutual capacitance measurements. Force and capacitance measurements may be concurrent or time multiplexed.

Using each driving electrode 21 and each sensing electrode 22 for piezoelectric force measurements. Additionally using second electrodes 22 as transmitting electrodes for mutual capacitance measurements and using driving electrodes 21 as receiving electrodes for mutual capacitance measurements. Force and capacitance measurements may be concurrent or time multiplexed.

Signals to and/or from the first electrodes 6, 21, 22 are transmitted off the sensor 23 to electronics 17 via conductive traces 33 which extend from the principal surface portion 24 across the fold line 26*d*, side surface portion 25*d* and fold line 28 onto the fold-under portion 27.

Figure 4:
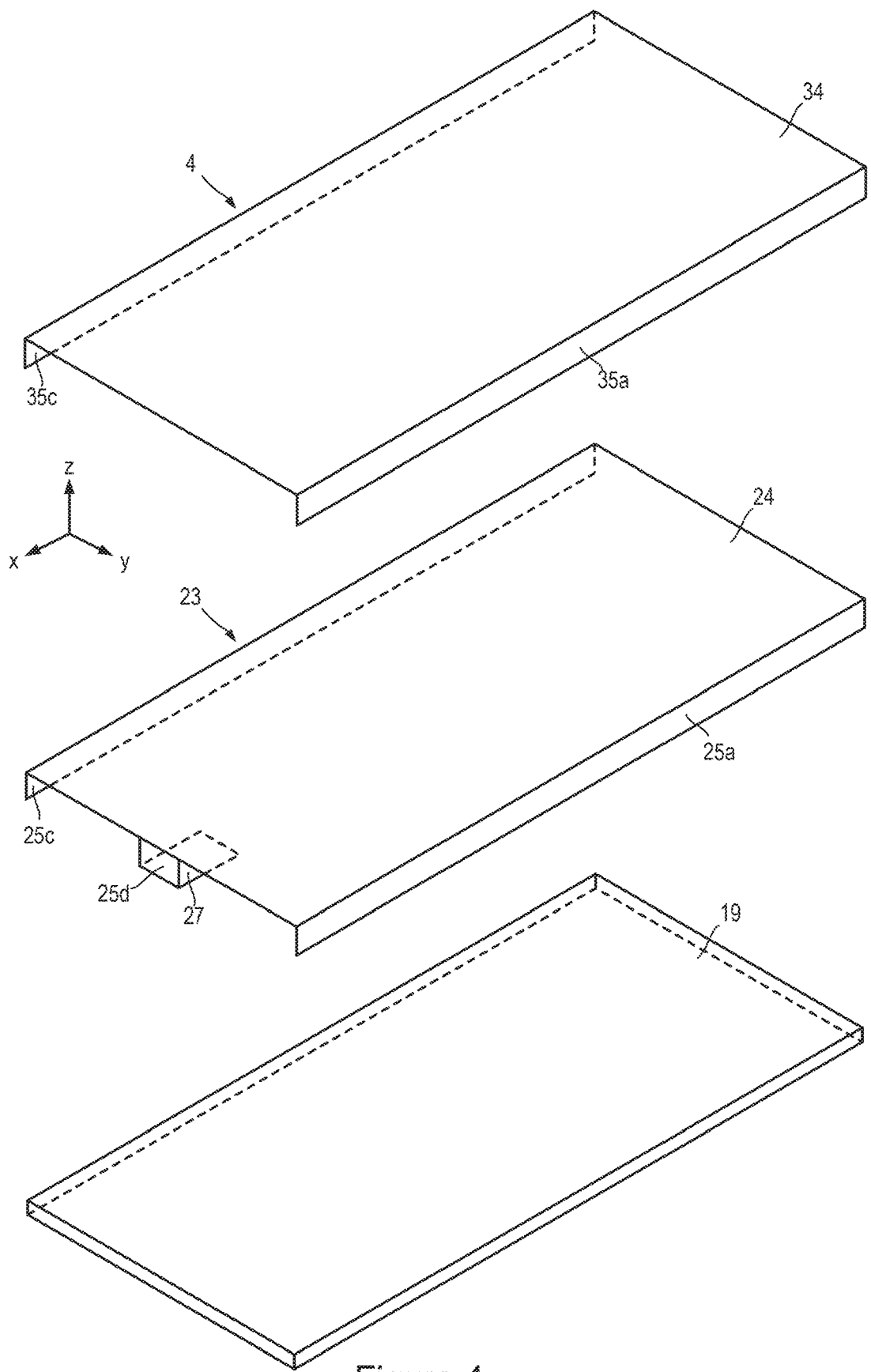
FIG. 4 is an exploded projection view of an assembly including the sensor of FIG. 3.

Referring also to FIG. 4, an exploded view of a touch-screen assembly for a mobile phone or smart phone is shown.

When assembled, the side surface portions 25*a*, 25*c*, 25*d* of the sensor 23 extend past the edges of the display 19, and the fold-under portion folds beneath the display 19 for connection to the electronics 17 (FIG. 2). The assemblage of the sensor 23 and display 19 may then be installed inside a body 2 of a device 1 in the form of a mobile phone. Either before or after installing the sensor 23 in the body 2, a cover 4 having a principal surface 34 and side portions 35*a*, 35*c* is placed over, or laminated to, the sensor 23. In some examples, the side portions 35*a*, 35*c* may be opaque or translucent. However, if the display 19 is capable of emitting from the sides, then the side portions 35*a*, 35*c* may be transparent.

Referring again to FIG. 3, third electrodes 10 defining pressure sensitive buttons 16 are disposed on the side surface portions 25*a*, 25*c*. When the sensor 23 is folded and installed in the mobile phone (FIG. 4), the third electrodes 10 will provide pressure sensitive buttons 16 corresponding to side surfaces 13*a*, 13*c* of the body 2 of the mobile phone. Signals to and/or from the third electrodes 10 are transmitted off the sensor 23 to electronics 17 via conductive traces 33 which extend from the corresponding side surface portion 25*a*, 25*c* across the respective fold line 26*a*, 26*c*, the principal surface portion 24, the fold line 26*d*, side surface portion 25*d* and fold line 28 onto the fold-under portion 27.

The third electrodes 10 on each side surface portion 25*a*, 25*c* may each be opposed by a counter electrode in the form of a single fourth electrode 11. Alternatively, each third electrode 10 may be opposed by a corresponding, and optionally co-extensive, fourth electrode 11, which may be advantageous for enabling a differential measurement of the piezoelectric charge $Q_{piezo}$ corresponding to each force sensitive button 15. In other examples, a single second electrode 7 may span the fold lines 26*a*, 26*c* in order to be coextensive with the principal surface portions 24 and the side surface portions 25*a*, 25*c*. Such a single second electrode 7 may act as a counter-electrode for measurements of piezoelectric charges $Q_{piezo}$ induced on any of the first electrodes 6 and/or third electrodes 10.

In this way, the construction of a device 1 including force sensitive buttons 16 on one or more side surfaces 13*a*, 13*b*, 13*c*, 13*d* may be simplified. In particular, the first electrodes 6 and third electrodes 10 may be deposited and/or patterned in a single processing step. The resulting sensor 23 may then be folded to conform to the shape of the device 1 body 2.

Alternatively, an additional dielectric layer (not shown) may be disposed between the driving and sensing electrodes 21, 22. This will still allow a simplified construction because the third electrodes 10 may be deposited and/or patterned in a single processing step with the driving electrodes 21 or the sensing electrodes 22.

The construction may be simplified further when a single, co-extensive second electrode 7 is used, as described hereinbefore.

The same techniques may be easily adapted to add one or more second piezoelectric regions 8 to the rear surface 14 of the body 2, for example, by adding a rear surface portion (not shown) and a further fold line (not shown) to the sensor 23. The same techniques may be easily adapted to add one or more second piezoelectric regions 8 to the principal surface 12, such second piezoelectric regions 8 being offset from the touch panel 3.

Although devices 1 have been illustrated in which the touch panel 3 is rectangular in shape, this is not necessary. In general, the touch panel 3 may have any shape suitable for a desired application or design, for example, the touch panel 3 may be circular.

Figure 5:
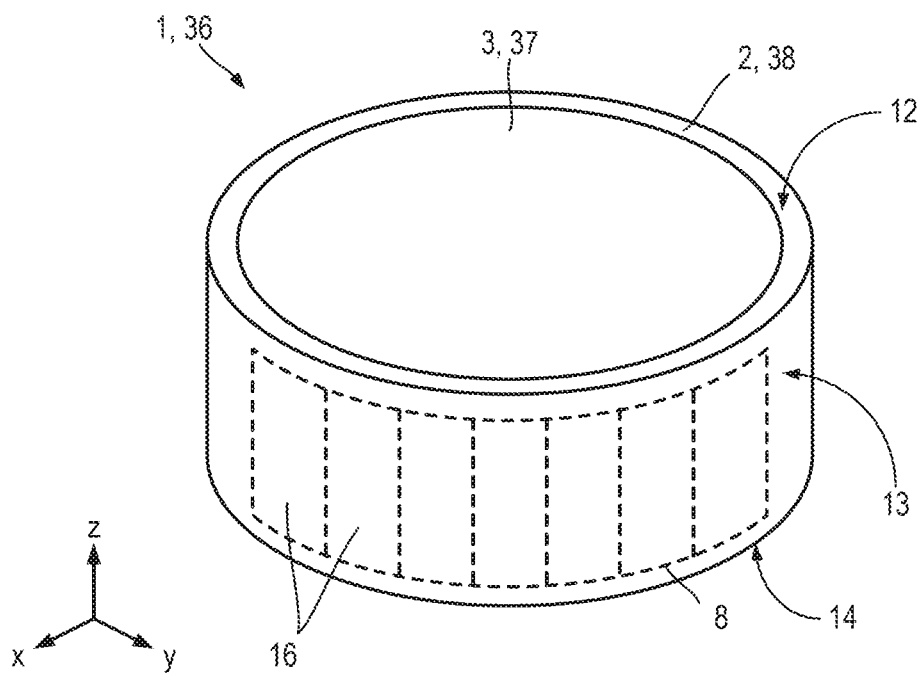
FIG. 5 is a projection view of a device having a circular touch panel.

Referring also to FIG. 5, a device 1, 36 having a circular touch panel 3, 37 is shown.

The circular touch panel 3, 37 is supported by, integrated with, or underlies a principal surface 12 of a cylindrical body 2, 38 of the device 36. A second piezoelectric input region 8 extends at least partway around the circumference of a single, curved side surface 13 of the cylindrical body 2, 38. In some examples, the second piezoelectric input region 8 may run entirely around the circumference of a curved side surface 13 of the cylindrical body 2, 38. Third electrodes 10 define a number of pressure sensitive buttons 16 on the curved side surface 13 of the cylindrical body 2, 38.

The second piezoelectric input region 8 supported by, integrated with, or underlying the curved side surface 13 of the cylindrical body 2, 38 may be provided using a second, strip-like layer of piezoelectric material (not shown) separate from the layer of piezoelectric material 5 of the touch panel 3. Alternatively, the second piezoelectric input region 8 supported by, integrated with, or underlying the curved side surface 13 of the cylindrical body 2, 38 may be provided as an extension of the layer of piezoelectric material 5.

Figure 6:
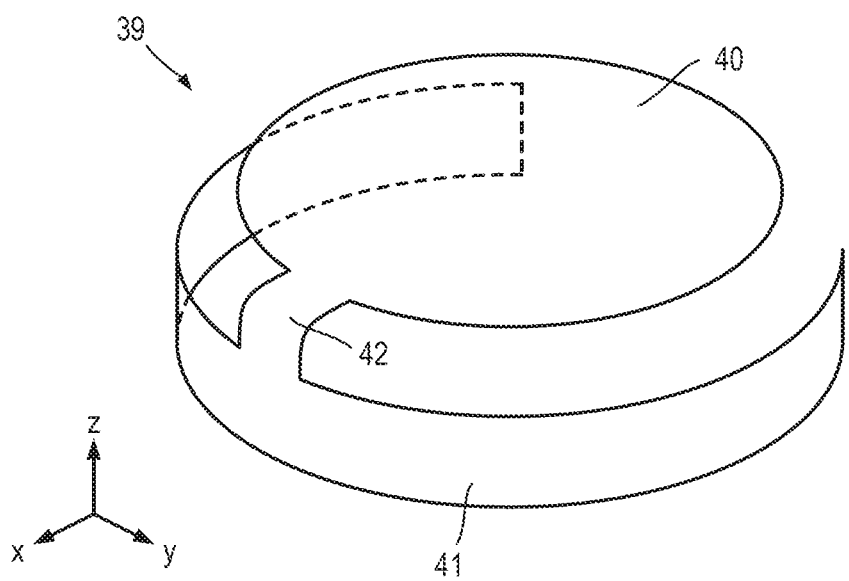
FIG. 6 is a projection view of a folded sensor for use in a device having a circular touch panel.

Referring also to FIG. 6, a folded sensor 39 for a device 1, 36 having a circular touch panel 3, 37 is illustrated.

The sensor 39 includes a principal surface portion 40 corresponding to the circular touch panel 3, 37, and a side surface portion 41 which is free to be wrapped around cylindrically to conform to the shape of the curved side surface 13 of the cylindrical body 2, 38. The principal surface portion 40 is connected to the side surface portion 41 by a connecting portion 42 which, when installed, bends from the plane (x-y) of the circular touch panel 3, 37 to third direction z perpendicular to the circular touch panel 3, 37 and parallel to the axis of the cylindrical body 2, 38. When a number of pressure sensitive buttons 16 are disposed about all, or at least a portion, of the circumference of the curved side surface 13 of the cylindrical body 2, 38, the device 36 may be configured to receive input in the form of a twisting movement/gesture about the circular touchscreen 3, 37. For example, a user may grip the curved side surface 13 of the cylindrical body 2, 38 on opposite sides between a finger and thumb, then move the finger and thumb clockwise or anti-clockwise (counter-clockwise) about the curved side surface 13. The device 1, 36 may receive the twisting gesture as an input instructing a program being executed by the device 1, 36 (or a separate computing device connected thereto) to carry out a function to scroll up/down, to zoom in/out, to move a selection of an icon in a menu, and so forth.

Figure 7:
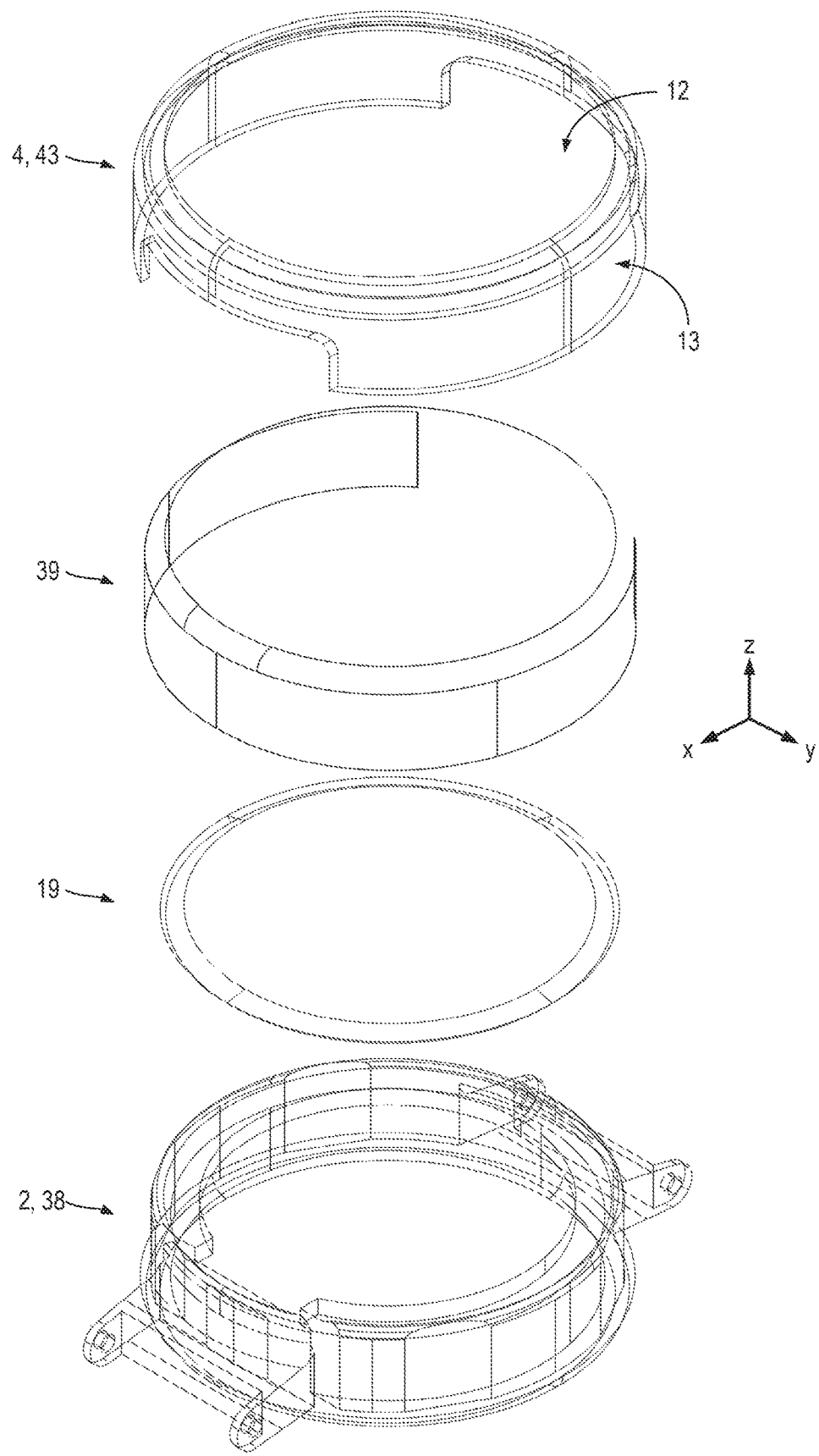
FIG. 7 is an exploded projection view of a device having a circular touch panel.

Referring also to FIG. 7, an exploded perspective view of an assembly of a device 1, 36 in the form of a smart watch is shown. The cylindrical body 2, 38, receives a display 19 and the sensor 39. The cylindrical body 2, 38 need not be perfectly cylindrical, and in general will include additional, non-cylindrically symmetric features necessary for assembly to other component such as, for example, straps, electronics 17, battery 18 and so forth. A watch cover 4, 43 is fitted to the cylindrical body 2, 38 over the sensor 39 and display 19.

The principles applied to the sensor 39 may equally be applied to any other shape of touch panel 3 supported by a principal surface 12 of a prismatic body 2 such as, for example, elliptical, triangular, square, pentagonal, any other regular or irregular polygon, or even irregularly shaped.

Examples have been described and shown in which second piezoelectric input regions 8 are disposed on side surfaces 13, 13a to 13d of a device 1, 36. In some examples, it may be desired to provide one or more second piezoelectric input regions 8 supported by, integrated with, or underlying the same principal surface 12 as the touch panel 3.

Figure 8:
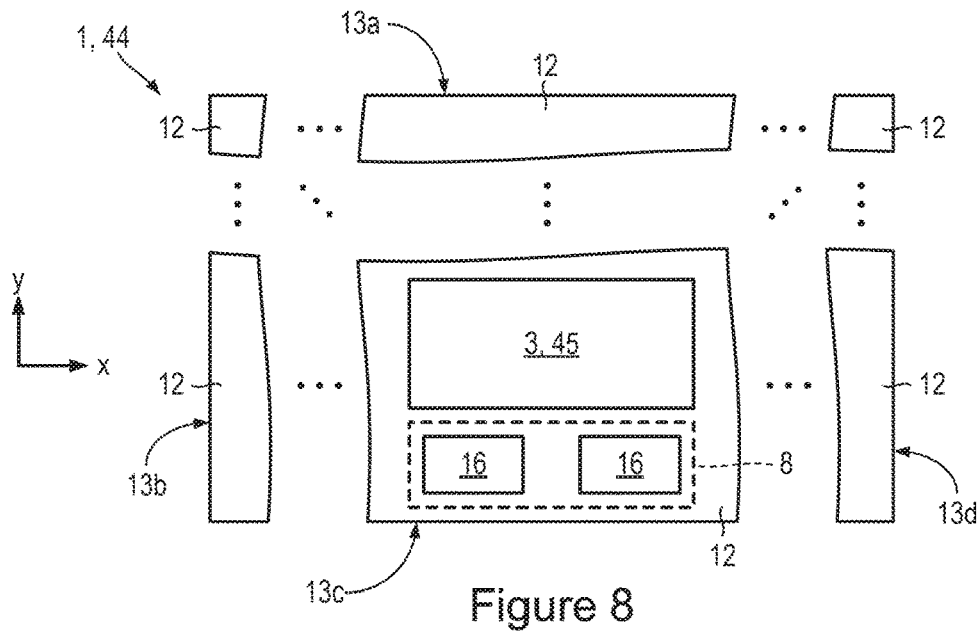
FIG. 8 is a plan view of a device incorporating an integral track-pad.

Referring also to FIG. 8, a device 1, 44 incorporating an integral track-pad 3, 45 is shown.

The device 1, 44 may take the form of, for example, a laptop computer, a terminal for public use (for example an information directory), a home appliance, and so forth.

The device 1, 44 has a principal surface 12 which is in general more extensive than the touch panel 3 in the form of an integral track-pad 3, 45. A display 19 may be provided elsewhere on the principal surface 12. A display 19 may correspond to a majority of the principal surface 12, but in this example does not underlie the integral track-pad 3, 45. A second piezoelectric input region 8 slightly offset from the integral track-pad 3, 45 includes third electrodes 10 defining a number, for example two, of pressure sensitive buttons 16.

The buttons 16 may correspond to functions such as, for example, a left mouse click and a right mouse click. In other examples, a third pressure sensitive button 16 may be included to correspond to a middle mouse click.

An arrangement as illustrated in FIG. 8 has previously been implemented in laptop computers using a capacitive track-pad paired with either mechanical buttons or capacitive buttons for the mouse button functions. Mechanical buttons use moving parts which may break, and also may add points of weakness for ingress of liquids/small particles into the device 1, 44. Capacitive buttons in close proximity to a capacitive track-pad may experience problems with inadvertent actuation by a user's palm as they use their fingers on the capacitive track-pad. A user may need to arch their hands when using the capacitive track-pad to avoid accidental triggering of capacitive mouse buttons, which can result in discomfort and/or repetitive strain injuries.

Using devices 1, 44 and methods according to the present specification, a pressure threshold for actuating the buttons 16 may be used. This may enable a user to maintain a relaxed hand shape, and to use a fingertip on the integrated track-pad whilst the rest of their hand rests on the principal surface 12, without risk of accidentally triggering a left- or right-mouse click from the buttons 16.

Figure 9:
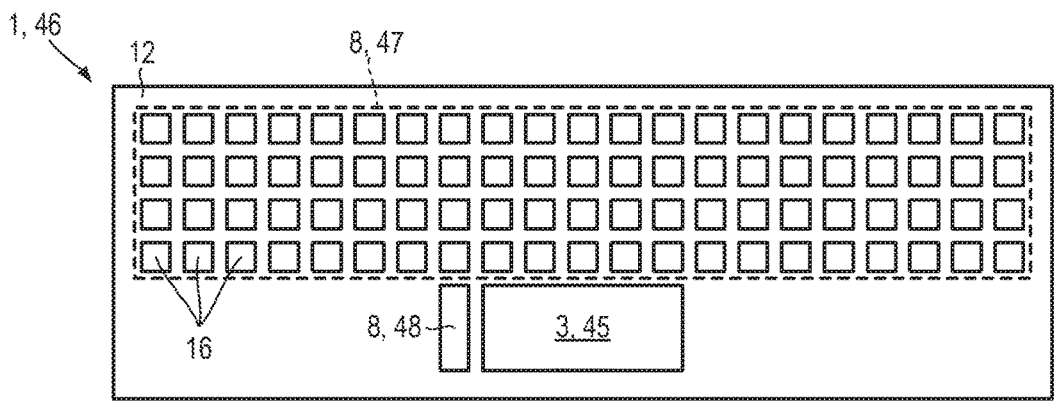
FIG. 9 is a plan view of a device in the form of a peripheral device.

Referring also to FIG. 9, a peripheral device 1, 46 is shown.

A principal surface 12 of the peripheral device 1, 46 includes, supports, or overlies an integral track pad 3, 45, a second piezoelectric input region 8 providing a number of buttons 16 in the form of a keyboard 47, and a second piezoelectric input region 8 configured as described hereinbefore to provide a scroll-bar 48. The track pad 45, keyboard 47 and scroll bar 48 are formed with a single, common layer of piezoelectric material 5. When included, one or more dielectric layers (not shown) may be coextensive with the layer of piezoelectric material 5. Optionally, a single second electrode 7 may be co-extensive with the track pad 45, keyboard 47 and scroll bar 48 to further simplify fabrication.

The peripheral device 1, 46 is configured for wired or wireless connection to a separate computing device (not shown), in order to provide input to the separate computing device (not shown). For example, the peripheral device 1, 46 may be keyboard and/or mouse for connection to a laptop or desktop computer (not shown) using a universal serial bus (USB) wired connection. In examples where the peripheral device 1, 46 uses a wired connection to the separate computing device (not shown), a battery 18 may be omitted and the peripheral device 1, 46 may be powered by the separate computing device (not shown) via the wired connection. In another example, the peripheral device 1, 46 may take the form of a screen cover for a tablet computer (not shown), connected to the tablet computer (not shown) by a wireless connection such as Bluetooth (RTM). The peripheral device 1, 46 in the form of a screen cover may cover a display of the tablet computer when not in use, and may function as a keyboard and/or mouse for input when folded back to reveal the tablet display.

In general the peripheral device 1, 46 may have a body 2 which is rigid, flexible, or articulated (rigid sections connected by flexible sections). In some examples, the peripheral device 1, 46 may measure a combination of piezoelectric signals and capacitances from the track pad 45, keyboard 47 and scroll bar 48, as described hereinbefore.

Figure 10:
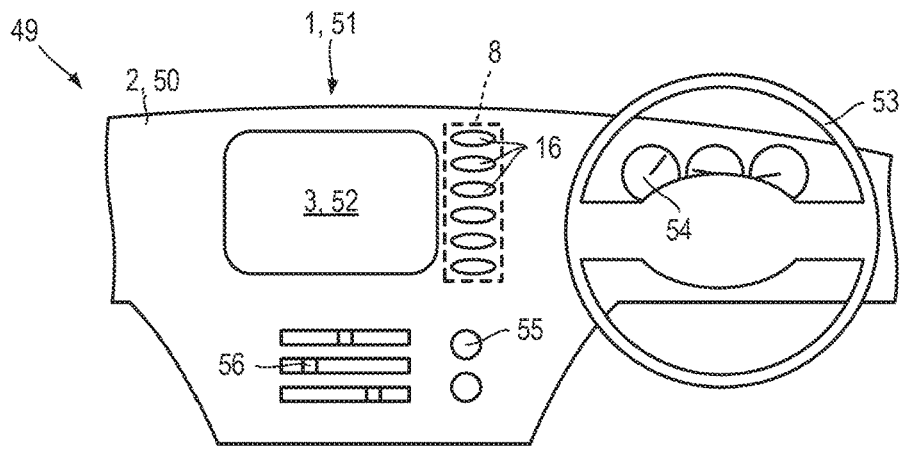
FIG. 10 illustrates a portion of a vehicle control panel including an embedded device.

Referring also to FIG. 10, a portion of a vehicle control panel 49 (also known as a "dashboard") is shown.

The vehicle control panel 49 includes a housing 50 which in this case also serves as the body 2 of a device 1, 51 embedded centrally (between driver and passenger side) in the vehicle control panel 49. The device 1, 51 includes a touchscreen 3, 52 and an adjacent second piezoelectric input region 8 providing a number of pressure sensitive buttons 16. The touchscreen 3, 52 and adjacent second piezoelectric input region 8 are formed from a single, common layer of piezoelectric material 5. Optionally, to further simplify fabrication, a single second electrode 7 may be co-extensive with the touchscreen 3, 52 and adjacent second piezoelectric input region 8 to further simplify fabrication.

In some examples, a device 1, 51 embedded in a vehicle control panel 49 may measure a combination of piezoelectric signals and capacitances from the touchscreen 3, 52 and the adjacent second piezoelectric input region 8, as described hereinbefore.

The vehicle control panel 49 also includes conventional features such as a steering wheel 53 and information dials 54 (digital and/or analog) which present information such as speed, engine revolutions per minute and so forth. The vehicle control panel 49 also includes conventional dial controls 55 and conventional slider controls 56 located centrally between driver and passenger sides. The conventional dial controls 55 and conventional slider controls 56 may be used for auxiliary functions such as, for example, environmental controls for heaters, air conditioning and so forth.

Note that although the vehicle control panel 49 is for a right-hand-drive vehicle (for example for use in the United Kingdom), the device 1, 51 may also be embedded in a vehicle control panel 49 for a left-hand-drive vehicle.

In some examples, the layer of piezoelectric material 5 (and any associated dielectric layers) may be extended further under the vehicle control panel 49 in order to replace conventional dial controls 55 and/or conventional slider controls 56 which further second piezoelectric input regions 8 providing piezoelectric-based slider and/dial controls. For example, a dial may be implemented in the same way as described hereinbefore for a slider, except with corresponding third electrodes 10 arranged around the circumference of a circle instead of in a straight line.

Modifications

It will be appreciated that many modifications may be made to the embodiments hereinbefore described. Such modifications may involve equivalent and other features which are already known in the design, manufacture and use of touch panels, capacitive sensing and/or force sensing and which may be used instead of or in addition to features already described herein. Features of one embodiment may be replaced or supplemented by features of another embodiment.

Examples of devices 1, 36, 44 have been illustrated with reference to first, second and third directions corresponding to orthogonal axes labelled x, y, and z. However, the first, second and third directions need not form a right handed orthogonal set.

Examples of devices 1, 36, 44, 46, 51 have been illustrated as having a flat principal surface 12. This is not necessary, and in some examples the principal surface 12 may be curved. In some examples, the body 2 may be curved and shaped such that no real distinction may be drawn between principal, side and rear surfaces 12, 13, 14. The devices 1 and methods of the present application remain applicable to such bodies 2, and may even be advantageous because the layer of piezoelectric material 5 may be readily bent, folded and cut into a shape able to conform to any shape of body 2.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicant hereby gives notice that new claims may be formulated to such features and/or combinations of such features during the prosecution of the present application or of any further application derived therefrom.

The invention claimed is:

1. A device comprising:
    a body having a principal surface and one or more second surfaces, the one or more second surfaces comprising:
        a rear surface opposing the principal surface across the body; and
        one or more side surfaces, each side surface adjoined to the principal surface by a respective connecting edge, and connecting the principal surface to the rear surface, wherein the one or more connecting edges extend around the perimeter of the principal surface;
    a touch panel configured on the principal surface of the body, the touch panel comprising a layer of piezoelectric material disposed between a plurality of first electrodes and at least one second electrode, wherein the layer of piezoelectric material comprises a net which is folded to conform to at least a shape of a part of the body; and,
    at least one second piezoelectric input region, each at least one second piezoelectric input region comprising an extension of the layer of piezoelectric material and configured on one of the one or more second surfaces of the body,
    wherein the device is configured to receive user input using the touch panel and/or the at least one second piezoelectric input region.

2. The device according to claim 1, wherein the at least one second piezoelectric input region is configured on the principal surface of the body.

3. The device according to claim 1, wherein the at least one second piezoelectric input region comprises one or more third electrodes configured to provide force sensitive buttons.

4. The device according to claim 1, wherein the at least one second piezoelectric input region comprises a plurality of third electrodes configured to provide one or more slider controls.

5. The device according to claim 1, wherein the touch panel is substantially rectangular.

6. The device according to claim 5, wherein the device and the at least one second piezoelectric input region are configured to receive input in the form of a swiping movement.

7. The device according to claim 1, wherein the touch panel is substantially circular.

8. The device according to claim 7, wherein the device and the at least one second piezoelectric input region are configured to receive input in the form of a twisting movement about the substantially circular touchscreen.

9. The device according to claim 7, wherein the device and the at least one second piezoelectric input region are configured to receive input in the form of a swiping movement.

10. The device according to claim 1, wherein the device is a portable communications device.

11. The device according to claim 1, wherein the device is a smart watch.

12. The device according to claim 1, wherein the device is a mobile phone.

13. The device according to claim 1, wherein the touch panel and the at least one second piezoelectric input region are operative to receive input using a combination of piezoelectric signals and capacitive sensing.

14. The device according to claim 1, wherein the device is a peripheral for a computing device.

15. The device according to claim 14 wherein the touch panel and the at least one second piezoelectric input region are operative to receive input using a combination of piezoelectric signals and capacitive sensing.

16. The device of claim 1 wherein the at least one second piezoelectric input region is configured on at least one of the one or more side surfaces.

17. The device of claim 1 wherein the at least one second piezoelectric input region is configured on the rear surface.

18. The device of claim 1, wherein the connecting edges are curved between the principal surface and each side surface of the one or more side surfaces.

19. A device comprising:
a body having a principal surface and one or more second surfaces, the one or more second surfaces comprising:
a rear surface opposing the principal surface across the body; and
one or more side surfaces, each side surface adjoined to the principal surface by a respective connecting edge, and connecting the principal surface to the rear surface, wherein the one or more connecting edges extend around the perimeter of the principal surface;
a touch panel configured on the principal surface of the body, the touch panel comprising a layer of piezoelectric material disposed between a plurality of first electrodes and at least one second electrode; and,
at least one second piezoelectric input region, each second piezoelectric input region configured on one of the one or more second surfaces of the body,
wherein the device is configured to receive user input using the touch panel and/or the at least one second piezoelectric input region.

20. The device of claim 19, wherein the connecting edges are curved between the principal surface and each side surface of the one or more side surfaces.

* * * * *